United States Patent

Hao

(10) Patent No.: US 10,283,066 B2
(45) Date of Patent: May 7, 2019

(54) GOA CIRCUIT DRIVING ARCHITECTURE

(71) Applicant: Shenzhen China Star Optoelectronics Technology Co., Ltd., Shenzhen (CN)

(72) Inventor: Sikun Hao, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 82 days.

(21) Appl. No.: 15/539,692

(22) PCT Filed: May 18, 2017

(86) PCT No.: PCT/CN2017/084969
§ 371 (c)(1),
(2) Date: Jun. 26, 2017

(87) PCT Pub. No.: WO2018/192050
PCT Pub. Date: Oct. 25, 2018

(65) Prior Publication Data
US 2018/0374442 A1 Dec. 27, 2018

(30) Foreign Application Priority Data

Apr. 17, 2017 (CH) .......................... 2017 1 0250571

(51) Int. Cl.
*G09G 3/36* (2006.01)
*H01L 27/12* (2006.01)
(52) U.S. Cl.
CPC ......... *G09G 3/3677* (2013.01); *G09G 3/3611* (2013.01); *G09G 3/3688* (2013.01);
(Continued)

(58) Field of Classification Search
CPC .............. G09G 3/3614; G09G 3/3677; G09G 2300/0426; G09G 2310/0205
See application file for complete search history.

(56) References Cited

U.S. PATENT DOCUMENTS

2009/0304138 A1* 12/2009 Tsai ....................... G11C 19/28
377/79
2012/0120035 A1* 5/2012 Yang .................... G09G 3/3614
345/205

FOREIGN PATENT DOCUMENTS

CN          1825420 A       8/2006
CN        102063858 A       5/2011
(Continued)

*Primary Examiner* — Shaheda A Abdin
(74) *Attorney, Agent, or Firm* — Leong C. Lei

(57) ABSTRACT

The present invention provides a GOA circuit driving architecture, which comprises a plurality of data lines providing data signals, a plurality of scanning lines providing scanning signals, a plurality of pixel in array arrangement, each pixel is electrically connected to one of the data lines and one of the scanning lines. Odd stage GOA circuits are sequentially arranged on one side of AA area pixel Even stage GOA circuits are sequentially arranged on one other side of AA area pixel. Each stage of the GOA circuits outputs a gate signal to scan the corresponding scanning line, and each stage of the GOA circuits respectively are connected to a first low-frequency clock signal, a second low-frequency clock signal and a DC low voltage, the odd stage GOA circuits are connected to one of a first high-frequency clock signal and a third high-frequency clock signal, and the even stage of GOA circuits are connected to one of a second high-frequency clock signal and a fourth high-frequency clock signal. First two stage and last two GOA circuits are connected to the start signal. The GOA circuit driving architecture of the present invention reduces the frame space (Continued)

occupied by the GOA circuit and enables the display panel to be designed narrower or borderless.

10 Claims, 7 Drawing Sheets

(52) U.S. Cl.
CPC ... *H01L 27/124* (2013.01); *G09G 2300/0408* (2013.01); *G09G 2310/0264* (2013.01)

(56) References Cited

FOREIGN PATENT DOCUMENTS

| CN | 103377630 A | 10/2013 |
|----|-------------|---------|
| CN | 104882107 A | 9/2015 |
| KR | 1319322 B1 | 10/2013 |

* cited by examiner

GOA CIRCUIT DRIVING ARCHITECTURE

BACKGROUND OF THE INVENTION

Field of Invention

The present invention relates to the field of liquid crystal display, and more particularly to a GOA circuit driving architecture.

Description of Prior Art

For the high display quality, low price, easy to carry, etc., the LCD displays have become the display terminals of the mobile communication equipments, PCs, TVs, etc. The panel driving technology widely used in current TV LCD panel is gradually tending to apply the GOA technology. The GOA technology, meaning the Gate Driver on Array technology, can use the original manufacturing process of the tablet display panel to fabricate the driving circuit of the horizontal scan line on the substrate surrounding the display region. The GOA technology can simplify the manufacturing process of the display panel, and eliminate the IC bonding process on the direction of horizontal scan line, the manufacturing capacity is improved and the cost is reduced, and the integration level of the display panel is improved to make itself more suitable for producing the narrow border or no border display products, to meet the people's visual pursuit.

With the visual pursuit for narrower and narrower bezel of the LCD display, the GOA technology also needs to continue to reduce the border, which has become the problem, needs to be solved by the technical staff.

FIG. 1 shows a schematic diagram of a GOA multi-stage drive architecture according to a conventional flat panel display, which shows a multi-stage connection method for a GOA circuit for flat panel display in the prior art. The periphery of the GOA circuit on the left and right sides of the panel, a first low-frequency clock signal LC1, a second low-frequency clock signal LC2, a DC low-voltage VSS, and four high-frequency clock signals CK1-CK4 are both disposed. A plurality of data lines for providing a data signal, a plurality of scanning lines for providing a scanning signal, a plurality of pixels P array arranged, each pixel P is electrically connected to a data line and a scanning line; a plurality of GOA circuits are orderly arranged stage by stage as GOA (1), GOA (n−1), GOA (n), GOA (n+1), each GOA circuit outputs a gate signal to scan the corresponding gate line in the display device, Each of the GOA circuits electrically respectively connects the first low-frequency clock signal LC1, the second low-frequency clock signal LC2, the DC low-voltage VSS, and one high-frequency clock signal of the four high-frequency clock signals CK1-CK4. Specifically, the n-th stage GOA circuit respectively receives the first low-frequency clock signal LC1, the second low-frequency clock signal LC2, the DC low-voltage VSS, one of the high-frequency clock signal CK1-CK4, a signal G(n−2) and a start signal ST(n−2) generated by the n−2th stage GOA circuit, a signal G(n+2) generated by the n+2th stage GOA circuit, and generates G(n), ST(n) and Q (n) signals. It can be seen that there are a larger quantity of thin film transistor elements used in the existing GOA circuit for flat panel display, and five metal wires are required on the left and right sides of the display panel to transmit the first low-frequency clock signal LC1 and the second low-frequency clock Signal LC2, the DC low voltage VSS and one of the four high-frequency signals, which is bad to the production cost reduction and to the GOA circuit size reduction.

FIG. 2 shows a realistic GOA circuit according to a conventional flat panel display, which includes a start signal STV, a first low-frequency clock signal LC1, a second low-frequency clock signal LC2, a DC low voltage VSS, and four high-frequency clock signals CK1-CK4. The start signal is used to start the T11 of the first two stages of the GOA, and pull down the T31 and T41 of the last two stages of the GOA, the low-frequency signals LC1 and LC2 alternately carry the GOA circuit down-sustain. The GOA circuit is mainly used to keep Gn at a stable low potential VSS while the scanning line (gate line) required Gn signal is outputted mainly by one of the four high-frequency signals, to make the scan (gate) signal of the display panels open the TFT used to control the input of the data (date) signal, in other words, the pixel P can normally charge/discharge, when the scanning line (gate line) is at Off state. This kind of GOA display panel has larger scan line (gate line) frame, which cannot meet the needs of the narrower frame.

SUMMARY OF THE INVENTION

The objective of the present invention is to provide a GOA circuit driving architecture, to reduce the frame space occupied by the GOA circuit.

In order to achieve the objective, the present invention provides a GOA circuit driving architecture, which comprises a plurality of data lines providing data signals, a plurality of scanning lines providing scanning signals, a plurality of pixel in array arrangement, each pixel is electrically connected to one of the data lines and one of the scanning lines. Odd stage GOA circuits are sequentially arranged on one side of AA area pixel. Even stage GOA circuits are sequentially arranged on one other side of AA area pixel. Each stage of the GOA circuits outputs a gate signal to scan the corresponding scanning line, and each stage of the GOA circuits respectively are connected to a first low-frequency clock signal, a second low-frequency clock signal and a DC low voltage, the odd stage GOA circuits are connected to one of a first high-frequency clock signal and a third high-frequency clock signal, and the even stage of GOA circuits are connected to one of a second high-frequency clock signal and a fourth high-frequency clock signal. First two stage and last two GOA circuits are connected to the start signal.

Wherein a Nth stage GOA circuit comprises:

A first thin film transistor has a gate connected to an N−2 stage start signal terminal and a source and a drain respectively connected to an N−2th stage gate signal terminal and an Nth stage first circuit point.

A second thin film transistor has a gate connected to the Nth stage first circuit point, the source and the drain respectively connected to a high-frequency clock signal and an Nth stage gate signal terminal.

A third thin film transistor has a gate connected to the Nth stage first circuit point, the source and the drain respectively connected to the high-frequency clock signal and an Nth stage start signal terminal.

A capacitor is connected between the Nth stage first circuit point and the Nth stage gate signal terminal.

A fourth thin film transistor has a gate connected to an N+2th stage start signal terminal, the source and the drain respectively connected to the Nth stage gate signal terminal and the DC low voltage.

A fifth thin film transistor has a gate connected to the N+2th stage start signal terminal, a source and a drain respectively connected to the Nth stage first circuit point and the DC low voltage.

A sixth thin film transistor has a gate connected to an Nth stage second circuit point, the source and the drain respectively connected to the Nth stage gate signal terminal and the DC low voltage.

A seventh thin film transistor has a gate connected to the Nth stage second circuit point, the source and the drain respectively connected to the Nth stage first circuit point and the DC low voltage.

An eighth thin film transistor has a gate connected to an Nth stage third circuit point, the source and the drain respectively connected to the Nth stage gate signal terminal and the DC low voltage.

A ninth thin film transistor has a gate connected to the Nth stage third circuit point, the source and the drain respectively connected to the Nth stage first circuit point and the DC low voltage.

A tenth thin film transistor has a gate connected to the first low-frequency clock signal, the source and the drain respectively connecting the first low-frequency clock signal and the gate of an eleventh thin film transistor.

The eleventh thin film transistor has a source and a drain connected to the first low-frequency clock signal and an Nth stage third circuit point, respectively.

A twelfth thin film transistor has a gate connected to the Nth stage first circuit point, the source and the drain respectively connected to the Nth stage third circuit point and the DC low voltage.

A thirteenth thin film transistor has a gate connected to the second low-frequency clock signal, the source and the drain respectively connecting the second low-frequency clock signal and the gate of a fourteenth thin film transistor.

The fourteenth thin film transistor has a source and a drain respectively connected to the second low-frequency clock signal and an Nth stage second circuit point.

A fifteenth thin film transistor has a gate connected to the Nth stage first circuit point, the source and the drain respectively connected to the Nth stage second circuit point and the DC low voltage.

A sixteenth thin film transistor has a gate connected to the Nth stage first circuit point, the source and the drain respectively connected to the gate of the fourteenth thin film transistor and the DC low voltage.

A seventeenth thin film transistor has a gate connected to the Nth stage first circuit point, the source and the drain respectively connected to the gate of the eleventh thin film transistor and the DC low voltage.

An eighteenth thin film transistor has a gate connected to the Nth stage first circuit point, the source and the drain respectively connected to an N−2th gate signal terminal and a voltage drop circuit point.

Wherein the voltage drop circuit point is the high-frequency clock signal.

Wherein the voltage drop circuit point is the DC low voltage.

Wherein the voltage drop circuit point is the Nth stage start signal terminal.

Wherein the waveforms of the first, second, third and fourth high-frequency clock signals are the same and the phase orders are different by a quarter cycle.

Wherein the first low-frequency clock signal and the second low-frequency clock signal have the same waveforms and opposite phases.

The present invention further provides a GOA circuit driving architecture, which comprises a plurality of data lines providing data signals, a plurality of scanning lines providing scanning signals, a plurality of pixel in array arrangement, each pixel is electrically connected to one of the data lines and one of the scanning lines. Odd stage GOA circuits are sequentially arranged on one side of AA area pixel. Even stage GOA circuits are sequentially arranged on one other side of AA area pixel. Each stage of the GOA circuits outputs a gate signal to scan the corresponding scanning line, and each stage of the GOA circuits respectively are connected to a first low-frequency clock signal, a second low-frequency clock signal and a DC low voltage, the odd stage GOA circuits are connected to one of a first high-frequency clock signal and a third high-frequency clock signal, and the even stage of GOA circuits are connected to one of a second high-frequency clock signal and a fourth high-frequency clock signal. First two stage and last two GOA circuits are connected to the start signal.

Wherein the waveforms of the first, second, third and fourth high-frequency clock signals are the same and the phase orders are different by a quarter cycle.

Wherein the first low-frequency clock signal and the second low-frequency clock signal have the same waveforms and opposite phases.

Summary, the GOA circuit driving architecture of the present invention reduces the frame space, occupied by the GOA circuit, and enables the display panel to be designed narrower or borderless.

BRIEF DESCRIPTION OF THE DRAWINGS

For better understanding the technical proposals and other beneficial effects of the present invention, please refer the following detailed description of the present invention with the accompanying drawings.

DETAILED DESCRIPTION OF THE PREFERRED EMBODIMENTS

Figure 3:
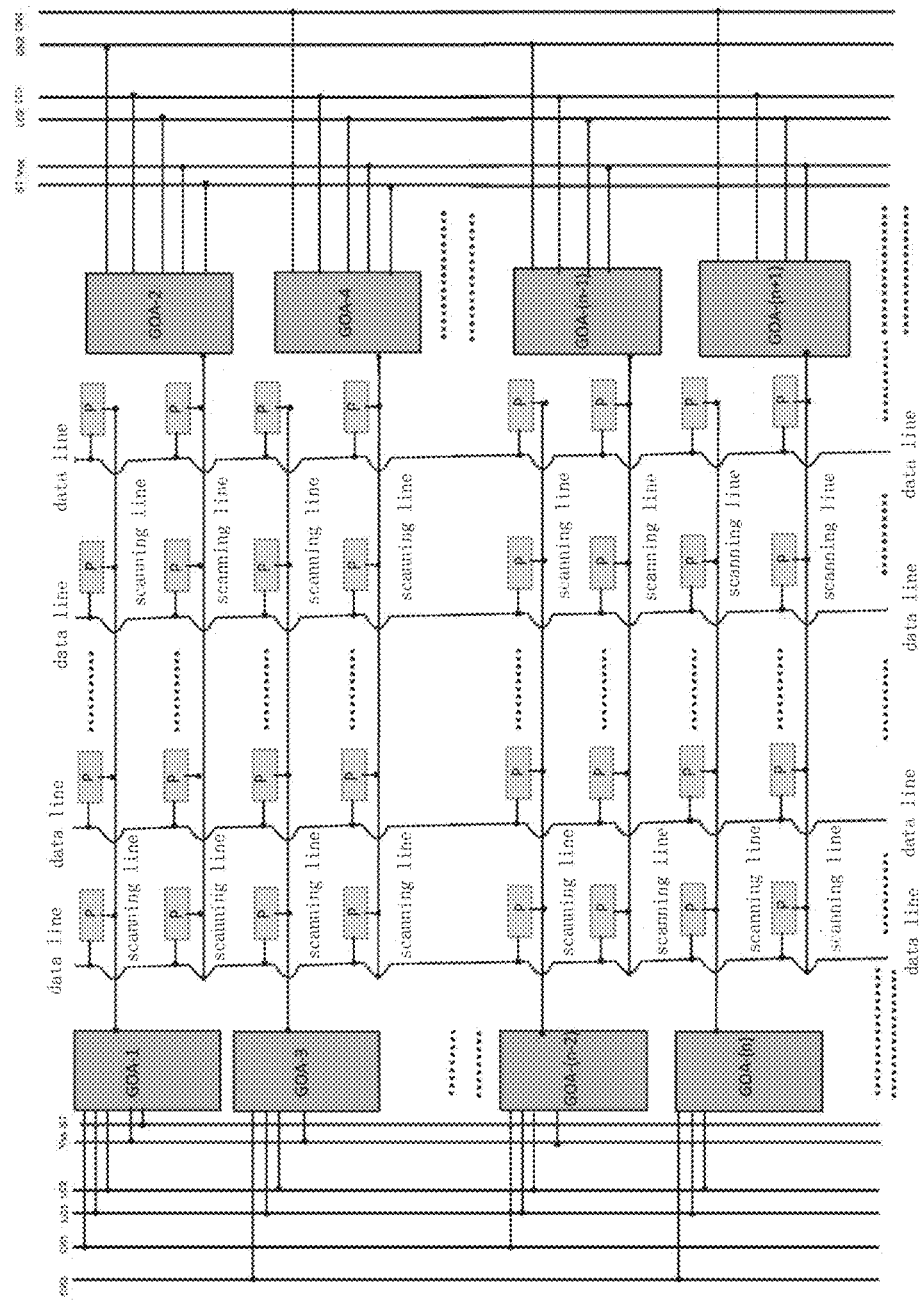
FIG. 3 shows a schematic diagram of a GOA circuit driving architecture according to the present invention.

As FIG. 3 shows a GOA circuit driving architecture of the present invention. The GOA circuit driving architecture uses the odd stage GOA circuits, such as the odd stage G1, driven on the left side of the AA (effective display) area, and the even stage G2 is driven on the right side of the AA pixel. The odd stage G3 is orderly driven on the left side of the pixel in the AA area, and the even stage G4 is orderly driven on the right side of the pixel in the AA area, and so on, to accomplish the driving of the pixel. This driving method can save half of the height occupied by the GOA circuit. If we take the area of one stage GOA circuit for example, the width of the GOA circuit can be reduced by half in terms of the height of the GOA circuit can be increased by double, further, the number of the high-frequency signal CK required for driving the GOA circuit can be reduced by half, then, the side border of the scan line side can be greatly reduced.

The GOA circuit driving architecture mainly comprises:

A plurality of data lines providing data signals, a plurality of scanning lines providing scanning signals, a plurality of pixel P in array arrangement, each pixel P is electrically connected to one of the data lines and one of the scanning lines. Odd stage GOA circuits are sequentially arranged on one side of AA area pixel Even stage GOA circuits are sequentially arranged on one other side of AA area pixel. Each stage of the GOA circuits outputs a gate signal to scan the corresponding scanning line, and each stage of the GOA circuits respectively are connected to a first low-frequency clock signal LC1, a second low-frequency clock signal LC2 and a DC low voltage VSS, the odd stage GOA circuits are connected to one of a first high-frequency clock signal CK1 and a third high-frequency clock signal CK3, and the even stage of GOA circuits are connected to one of a second high-frequency clock signal CK2 and a fourth high-frequency clock signal CK4. First two stage and last two GOA circuits are connected to the start signal ST.

Figure 4:
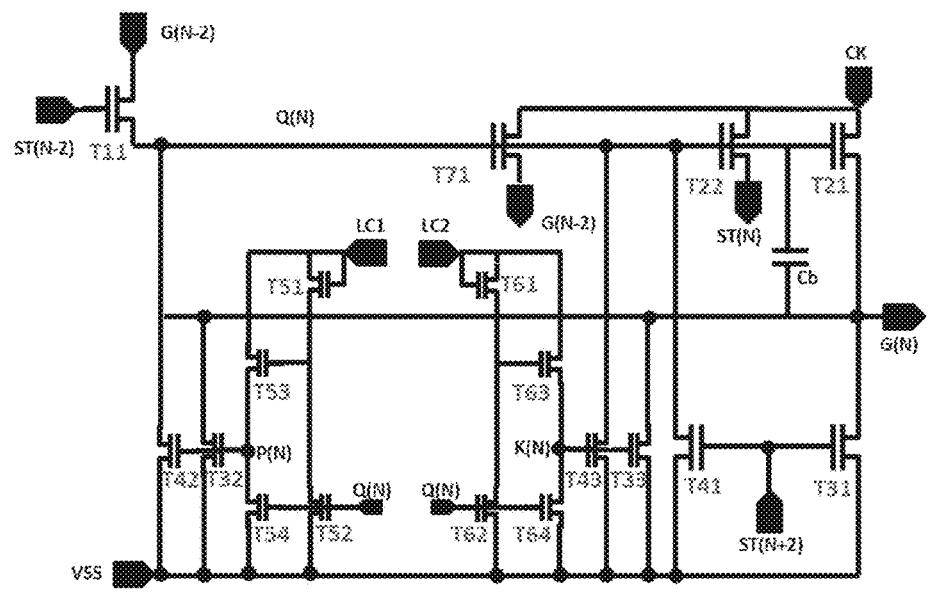
FIG. 4 shows a schematic diagram of applying a GOA circuit according to first embodiment of a GOA circuit driving architecture of the present invention.

FIG. 4 shows a schematic diagram of applying a GOA circuit according to first embodiment of a GOA circuit driving architecture of the present invention. A Nth stage GOA circuit comprises:

A thin film transistor T11 has a gate connected to an N−2 stage start signal terminal ST(N−2) and a source and a drain respectively connected to an N−2th stage gate signal terminal G(N−2) and an Nth stage first circuit point Q(N).

A thin film transistor T21 has a gate connected to the Nth stage first circuit point Q(N), the source and the drain respectively connected to a high-frequency clock signal CK and an Nth stage gate signal terminal G(N).

A thin film transistor T22 has a gate connected to the Nth stage first circuit point Q(N), the source and the drain respectively connected to the high-frequency clock signal CK and an Nth stage start signal terminal ST(N).

A capacitor Cb is connected between the Nth stage first circuit point Q(N) and the Nth stage gate signal terminal G(N).

A thin film transistor T31 has a gate connected to an N+2th stage start signal terminal ST(N+2), the source and the drain respectively connected to the Nth stage gate signal terminal G(N) and the DC low voltage VSS.

A thin film transistor T41 has a gate connected to the N+2th stage start signal terminal ST(N+2), a source and a drain respectively connected to the Nth stage first circuit point Q(N) and the DC low voltage VSS.

A thin film transistor T33 has a gate connected to an Nth stage second circuit point K(N), the source and the drain respectively connected to the Nth stage gate signal terminal G(N) and the DC low voltage VSS.

A thin film transistor T43 has a gate connected to the Nth stage second circuit point K(N), the source and the drain respectively connected to the Nth stage first circuit point Q(N) and the DC low voltage VSS.

A thin film transistor T32 has a gate connected to an Nth stage third circuit point P(N), the source and the drain respectively connected to the Nth stage gate signal terminal G(N) and the DC low voltage VSS.

A thin film transistor T42 has a gate connected to the Nth stage third circuit point P(N), the source and the drain respectively connected to the Nth stage first circuit point Q(N) and the DC low voltage VSS.

A thin film transistor T51 has a gate connected to the first low-frequency clock signal LC1, the source and the drain respectively connecting the first low-frequency clock signal LC1 and the gate of a thin film transistor T53.

The thin film transistor T53 has a source and a drain connected to the first low-frequency clock signal LC1 and an Nth stage third circuit point P(N), respectively.

A thin film transistor T54 has a gate connected to the Nth stage first circuit point Q(N), the source and the drain respectively connected to the Nth stage third circuit point P(N) and the DC low voltage VSS.

A thin film transistor T61 has a gate connected to the second low-frequency clock signal LC2, the source and the drain respectively connecting the second low-frequency clock signal LC2 and the gate of a thin film transistor T63.

The thin film transistor T63 has a source and a drain respectively connected to the second low-frequency clock signal LC2 and an Nth stage second circuit point K(N).

A thin film transistor T64 has a gate connected to the Nth stage first circuit point Q(N), the source and the drain respectively connected to the Nth stage second circuit point K(N) and the DC low voltage VSS.

A thin film transistor T62 has a gate connected to the Nth stage first circuit point Q(N), the source and the drain respectively connected to the gate of the thin film transistor T63 and the DC low voltage VSS.

A thin film transistor T52 has a gate connected to the Nth stage first circuit point Q(N), the source and the drain respectively connected to the gate of the thin film transistor T53 and the DC low voltage VSS.

A thin film transistor T71 has a gate connected to the Nth stage first circuit point Q(N), the source and the drain respectively connected to an N−2th gate signal terminal G(N−2) and a voltage drop circuit point.

Figure 1:
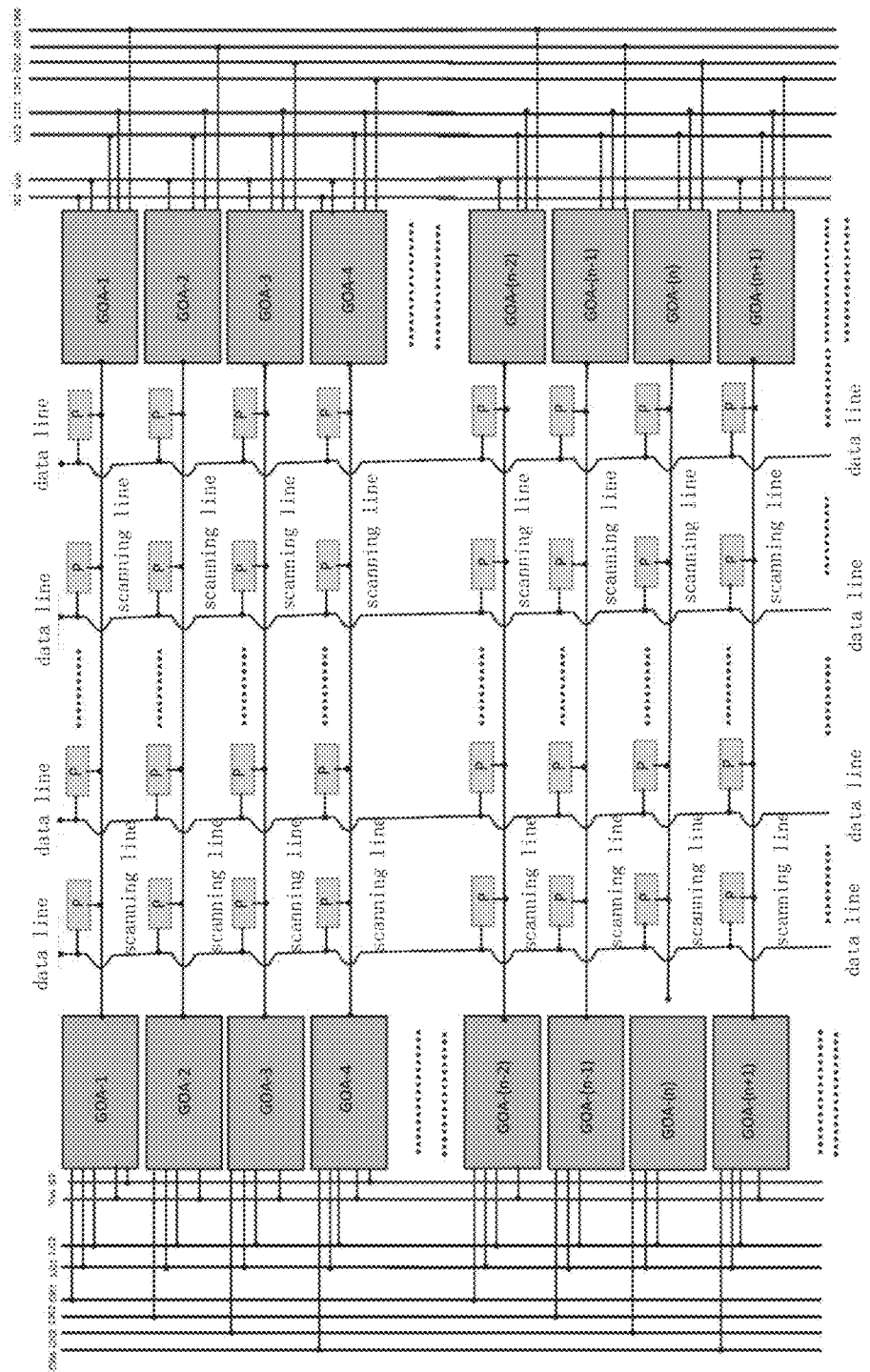
FIG. 1 shows a schematic diagram of a GOA multi-stage drive architecture according to a conventional flat panel display.
Figure 2:
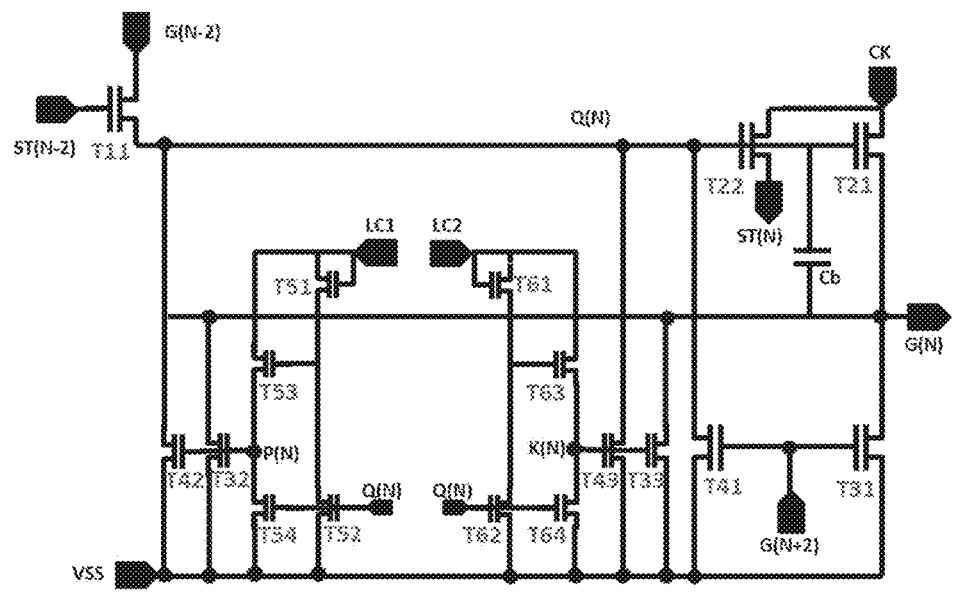
FIG. 2 shows a realistic GOA circuit according to a conventional flat panel display.

In FIG. 4, the voltage drop circuit point connected to T71 is the high-frequency clock signal CK. If one hope to use the driver architecture shown in FIG. 3, the only thing need to do is to add a TFT (T71) in the original GOA circuit as shown in FIG. 2, the reason of the current GOA circuit using the original driving architecture in FIG. 1 is that: after the GOA outputs the driving signal Gn, the falling time of the Gn signal is too long, and the falling time is longer at the far sides of the AA side, so that the panel may have different brightness at far/near sides, remote color shift and other issues. Hence, the GOA circuit in FIG. 4 can greatly shorten the falling time of the Gn signal with larger strength for pull-down, when the output of the gate of the GOA circuit changes to a low potential.

Figure 5:
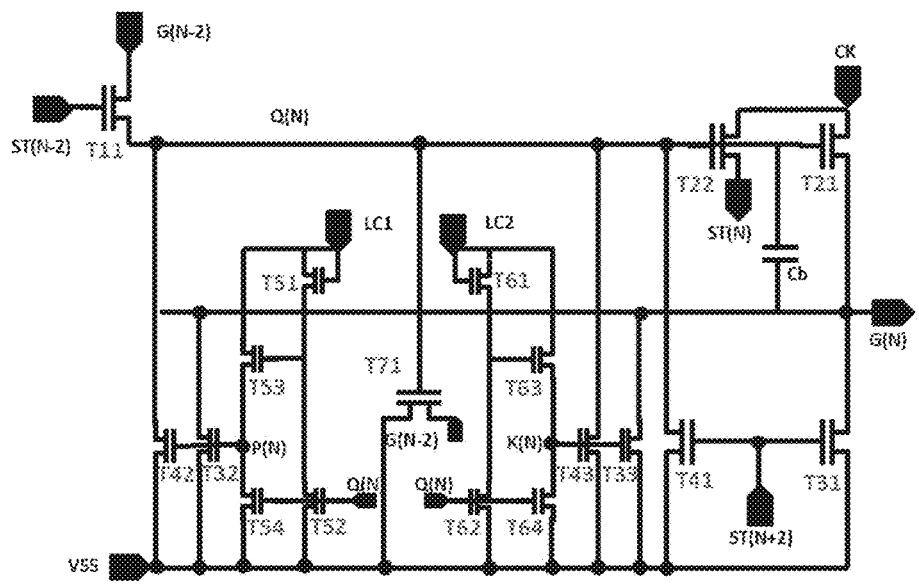
FIG. 5 shows a schematic diagram of applying a GOA circuit according to second embodiment of a GOA circuit driving architecture of the present invention.

FIG. 5 shows a schematic diagram of applying a GOA circuit according to second embodiment of a GOA circuit driving architecture of the present invention. The voltage drop circuit point connected to the T71 is the DC low voltage VSS. As shown in FIG. 5, with pulling down the source of the T71 in FIG. 4 to the DC low voltage VSS, the purpose of fast pull-down of Gn can be achieved, also.

Figure 6:
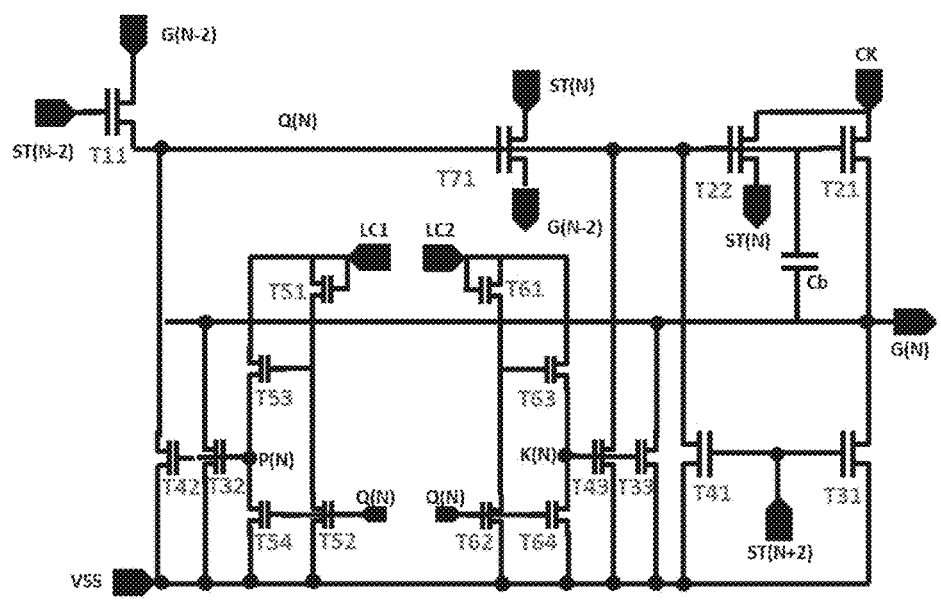
FIG. 6 shows a schematic diagram of applying a GOA circuit according to third embodiment of a GOA circuit driving architecture of the present invention.

FIG. 6 shows a schematic diagram of applying a GOA circuit according to third embodiment of a GOA circuit driving architecture of the present invention. The voltage drop circuit point connected to the T71 is the Nth stage start signal terminal ST (N). As shown in FIG. 6, with pulling down the T71 of FIG. 4 to STn, t, the purpose of fast pull-down of Gn can be achieved, also. At the same time, in the embodiment, the pull down of Gn is changed from original Gn+2 to ST(n+2), the advantage of doing so is not required Gn involved in pull-down, because the Gn output will actually be interfered by signals of AA area, date and others, the pull-down capability is not stable. Meanwhile, if Gn is abnormal caused by in-plane badness, then Gn−2 can't be pulled down, it will cause the entire GOA circuit to be abnormal. With using STn+2 to pull down, the pull-down will not have any interference within the plane, the most important is that STn is faster than Gn while pull-down, and is conducive to reducing the falling time of Gn.

Figure 7:
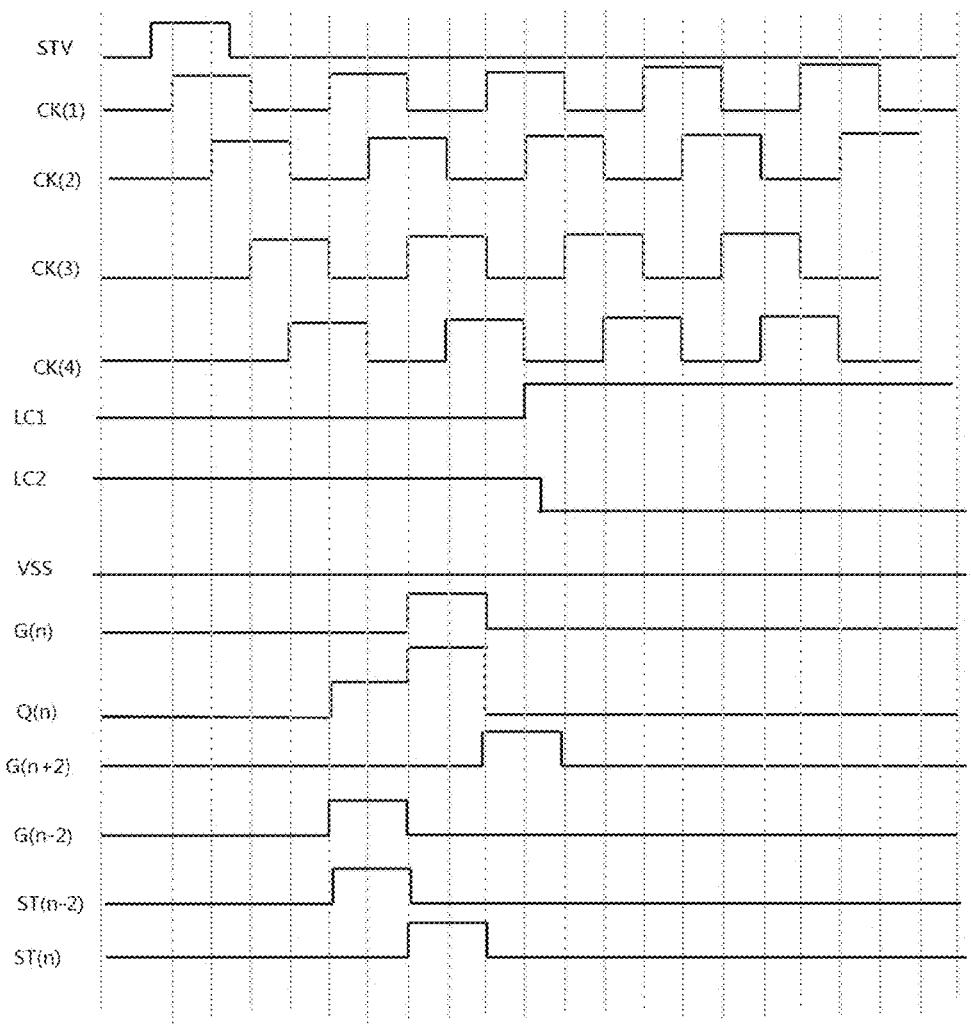
FIG. 7 is a GOA circuit time-domain diagram according to a GOA circuit driving architecture of the present invention.

FIG. 7 is a GOA circuit time-domain diagram according to a GOA circuit driving architecture of the present invention. The GOA circuit is applicable to all embodiments. Besides, the number of CK of the present invention may be any even number. The waveforms of the first, second, third and fourth high-frequency CK clock signals are the same, and the phase orders are different by a quarter cycle. The first low-frequency clock signal LC1 and the second low-frequency clock signal LC2 have the same waveform and opposite phases.

Summary, the GOA circuit driving architecture of the present invention reduces the frame space, occupied by the GOA circuit, and enables the display panel to be designed narrower or borderless.

As mentioned above, those of ordinary skill in the art, without departing from the spirit and scope of the present disclosure, can make various kinds of modifications and variations to the present disclosure. Therefore, all such modifications and variations are intended to be included in the protection scope of the appended claims of the present invention.

What is claimed is:

1. A GOA circuit driving architecture, comprising a plurality of data lines providing data signals, a plurality of scanning lines providing scanning signals, a plurality of pixel in array arrangement, each pixel being electrically connected to one of the data lines and one of the scanning lines; odd stage GOA circuits being sequentially arranged on one side of AA area pixel, even stage GOA circuits being sequentially arranged on one other side of AA area pixel, each stage of the GOA circuits outputs a gate signal to scan the corresponding scanning line, and each stage of the GOA circuits respectively being connected to a first low-frequency clock signal, a second low-frequency clock signal and a DC low voltage, the odd stage GOA circuits are connected to one of a first high-frequency clock signal and a third high-frequency clock signal, and the even stage of GOA circuits are connected to one of a second high-frequency clock signal and a fourth high-frequency clock signal, first two stage and last two GOA circuits being connected to the start signal;

wherein a Nth stage GOA circuit comprises:
a first thin film transistor having a gate connected to an N−2 stage start signal terminal and a source and a drain respectively connected to an N−2th stage gate signal terminal and an Nth stage first circuit point;
a second thin film transistor having a gate connected to the Nth stage first circuit point, the source and the drain respectively connected to a high-frequency clock signal and an Nth stage gate signal terminal;
a third thin film transistor having a gate connected to the Nth stage first circuit point, the source and the drain respectively connected to the high-frequency clock signal and an Nth stage start signal terminal;
a capacitor being connected between the Nth stage first circuit point and the Nth stage gate signal terminal;
a fourth thin film transistor having a gate connected to an N+2th stage start signal terminal, the source and the drain respectively connected to the Nth stage gate signal terminal and the DC low voltage;
a fifth thin film transistor having a gate connected to the N+2th stage start signal terminal, a source and a drain respectively connected to the Nth stage first circuit point and the DC low voltage;
a sixth thin film transistor having a gate connected to an Nth stage second circuit point, the source and the drain respectively connected to the Nth stage gate signal terminal and the DC low voltage;
a seventh thin film transistor having a gate connected to the Nth stage second circuit point, the source and the drain respectively connected to the Nth stage first circuit point and the DC low voltage;
an eighth thin film transistor having a gate connected to an Nth stage third circuit point, the source and the drain respectively connected to the Nth stage gate signal terminal and the DC low voltage;
a ninth thin film transistor having a gate connected to the Nth stage third circuit point, the source and the drain respectively connected to the Nth stage first circuit point and the DC low voltage;
a tenth thin film transistor having a gate connected to the first low-frequency clock signal, the source and the drain respectively connecting the first low-frequency clock signal and the gate of an eleventh thin film transistor;
the eleventh thin film transistor having a source and a drain connected to the first low-frequency clock signal and an Nth stage third circuit point, respectively;
a twelfth thin film transistor having a gate connected to the Nth stage first circuit point, the source and the drain respectively connected to the Nth stage third circuit point and the DC low voltage;
a thirteenth thin film transistor having a gate connected to the second low-frequency clock signal, the source and the drain respectively connecting the second low-frequency clock signal and the gate of a fourteenth thin film transistor;
the fourteenth thin film transistor having a source and a drain respectively connected to the second low-frequency clock signal and an Nth stage second circuit point;
a fifteenth thin film transistor having a gate connected to the Nth stage first circuit point, the source and the drain respectively connected to the Nth stage second circuit point and the DC low voltage;
a sixteenth thin film transistor having a gate connected to the Nth stage first circuit point, the source and the drain respectively connected to the gate of the fourteenth thin film transistor and the DC low voltage;
a seventeenth thin film transistor having a gate connected to the Nth stage first circuit point, the source and the drain respectively connected to the gate of the eleventh thin film transistor and the DC low voltage;
an eighteenth thin film transistor having a gate connected to the Nth stage first circuit point, the source and the drain respectively connected to an N−2th gate signal terminal and a voltage drop circuit point.

2. The GOA circuit driving architecture according to claim 1, wherein the voltage drop circuit point is the high-frequency clock signal.

3. The GOA circuit driving architecture according to claim 1, wherein the voltage drop circuit point is the DC low voltage.

4. The GOA circuit driving architecture according to claim 1, wherein the voltage drop circuit point is the Nth stage start signal terminal.

5. The GOA circuit driving architecture according to claim 1, wherein the waveforms of the first, second, third and fourth high-frequency clock signals are the same and the phase orders are different by a quarter cycle.

6. The GOA circuit driving architecture according to claim 1, wherein the first low-frequency clock signal and the second low-frequency clock signal have the same waveforms and opposite phases.

7. A GOA circuit driving architecture, comprising a plurality of data lines providing data signals, a plurality of scanning lines providing scanning signals, a plurality of pixel in array arrangement, each pixel being electrically connected to one of the data lines and one of the scanning lines; odd stage GOA circuits being sequentially arranged on one side of AA area pixel, even stage GOA circuits being sequentially arranged on one other side of AA area pixel, each stage of the GOA circuits outputs a gate signal to scan the corresponding scanning line, and each stage of the GOA circuits respectively being connected to a first low-frequency clock signal, a second low-frequency clock signal and a DC low voltage, the odd stage GOA circuits are connected to one of a first high-frequency clock signal and a third high-frequency clock signal, and the even stage of GOA circuits are connected to one of a second high-frequency clock signal and a fourth high-frequency clock signal, first two stage and last two GOA circuits being connected to the start signal;
   wherein the waveforms of the first, second, third and fourth high-frequency clock signals are the same and the phase orders are different by a quarter cycle;
   wherein the first low-frequency clock signal and the second low-frequency clock signal have the same waveforms and opposite phases;
   wherein a Nth stage GOA circuit comprises:
   a first thin film transistor having a gate connected to an N−2 stage start signal terminal and a source and a drain respectively connected to an N−2th stage gate signal terminal and an Nth stage first circuit point;
   a second thin film transistor having a gate connected to the Nth stage first circuit point, the source and the drain respectively connected to a high-frequency clock signal and an Nth stage gate signal terminal;
   a third thin film transistor having a gate connected to the Nth stage first circuit point, the source and the drain respectively connected to the high-frequency clock signal and an Nth stage start signal terminal;
   a capacitor being connected between the Nth stage first circuit point and the Nth stage gate signal terminal;
   a fourth thin film transistor having a gate connected to an N+2th stage start signal terminal, the source and the drain respectively connected to the Nth stage gate signal terminal and the DC low voltage;
   a fifth thin film transistor having a gate connected to the N+2th stage start signal terminal, a source and a drain respectively connected to the Nth stage first circuit point and the DC low voltage;
   a sixth thin film transistor having a gate connected to an Nth stage second circuit point, the source and the drain respectively connected to the Nth stage gate signal terminal and the DC low voltage;
   a seventh thin film transistor having a gate connected to the Nth stage second circuit point, the source and the drain respectively connected to the Nth stage first circuit point and the DC low voltage;
   an eighth thin film transistor having a gate connected to an Nth stage third circuit point, the source and the drain respectively connected to the Nth stage gate signal terminal and the DC low voltage;
   a ninth thin film transistor having a gate connected to the Nth stage third circuit point, the source and the drain respectively connected to the Nth stage first circuit point and the DC low voltage;
   a tenth thin film transistor having a gate connected to the first low-frequency clock signal, the source and the drain respectively connecting the first low-frequency clock signal and the gate of an eleventh thin film transistor;
   the eleventh thin film transistor having a source and a drain connected to the first low-frequency clock signal and an Nth stage third circuit point, respectively;
   a twelfth thin film transistor having a gate connected to the Nth stage first circuit point, the source and the drain respectively connected to the Nth stage third circuit point and the DC low voltage;
   a thirteenth thin film transistor having a gate connected to the second low-frequency clock signal, the source and the drain respectively connecting the second low-frequency clock signal and the gate of a fourteenth thin film transistor;
   the fourteenth thin film transistor having a source and a drain respectively connected to the second low-frequency clock signal and an Nth stage second circuit point;
   a fifteenth thin film transistor having a gate connected to the Nth stage first circuit point, the source and the drain respectively connected to the Nth stage second circuit point and the DC low voltage;
   a sixteenth thin film transistor having a gate connected to the Nth stage first circuit point, the source and the drain respectively connected to the gate of the fourteenth thin film transistor and the DC low voltage;
   a seventeenth thin film transistor having a gate connected to the Nth stage first circuit point, the source and the drain respectively connected to the gate of the eleventh thin film transistor and the DC low voltage;
   an eighteenth thin film transistor having a gate connected to the Nth stage first circuit point, the source and the drain respectively connected to an N−2th gate signal terminal and a voltage drop circuit point.

8. The GOA circuit driving architecture according to claim 7, wherein the voltage drop circuit point is the high-frequency clock signal.

9. The GOA circuit driving architecture according to claim 7, wherein the voltage drop circuit point is the DC low voltage.

10. The GOA circuit driving architecture according to claim 7, wherein the voltage drop circuit point is the Nth stage start signal terminal.

* * * * *